US012765427B2

(12) United States Patent
Alawani et al.

(10) Patent No.: US 12,765,427 B2
(45) Date of Patent: Oct. 13, 2026

(54) INTEGRATED CIRCUIT(IC) PACKAGE HAVING A SUBSTRATE EMPLOYING REDUCED AREA, ADDED METAL PAD(S) TO METAL INTERCONNECT(S) TO REDUCE DIE-SUBSTRATE CLEARANCE

(71) Applicant: QUALCOMM Incorporated, San Diego, CA (US)

(72) Inventors: Ashish Alawani, San Diego, CA (US); Abhishek Shrikant Agarwal, Gilbert, AZ (US); Heun Gun Shin, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 379 days.

(21) Appl. No.: 18/531,423

(22) Filed: Dec. 6, 2023

(65) Prior Publication Data

US 2025/0192099 A1    Jun. 12, 2025

(51) Int. Cl.
*H10W 90/00* (2026.01)
*H10W 70/685* (2026.01)

(52) U.S. Cl.
CPC ......... *H10W 90/00* (2026.01); *H10W 70/685* (2026.01); *H10W 90/701* (2026.01);
(Continued)

(58) Field of Classification Search
CPC . H10W 90/00; H10W 70/685; H10W 90/701; H10W 90/723; H10W 90/724;
(Continued)

(56) References Cited

U.S. PATENT DOCUMENTS 6,580,159 B1 6/2003 Fusaro et al.
10,600,838 B2 * 3/2020 Wakiyama ............ H10F 39/809
(Continued)

OTHER PUBLICATIONS

Definition of "substrate" downloaded from URL <https://www.jedec.org/standards-documents/dictionary/terms/substrate-semiconductor-device-1-general> on May 6, 2026. (Year: 2026).*
(Continued)

*Primary Examiner* — Joe E. Schoenholtz
(74) *Attorney, Agent, or Firm* — Withrow & Terranova, PLLC

(57) ABSTRACT

Integrated circuit package having a substrate employing reduced area, added metal pad(s) to metal interconnect(s) to reduce a die to a substrate clearance and related fabrication methods are disclosed. The IC package includes die interconnects coupled to first metal pad(s) of respective metal interconnects of a metallization layer of the substrate to provide support and signal routing paths. To reduce clearance between the die and the substrate and consequently the height of the IC package, a second, additional metal pad(s) having a reduced cross-sectional area from the first metal pad(s) is coupled to the first metal pad(s). Solder is employed to couple the second, additional metal pad(s) to a die interconnect(s) of the die to couple the die to the substrate. When the solder is heated to form the solder joint, the solder flows along the reduced cross-sectional area of the second, additional metal pad(s).

16 Claims, 9 Drawing Sheets

(52) U.S. Cl.
CPC ........ *H10W 90/723* (2026.01); *H10W 90/724* (2026.01); *H10W 90/792* (2026.01)

(58) Field of Classification Search
CPC . H10W 90/792; H10W 72/29; H10W 72/926; H10W 72/932; H10W 72/944; H10W 72/072; H10W 72/20; H10W 72/221; H10W 72/923; H10W 72/934; H10W 72/936; H10W 90/794; H10W 72/019
See application file for complete search history.

(56) References Cited

U.S. PATENT DOCUMENTS

| | | | | |
|---|---|---|---|---|
| 10,629,507 | B1 | 4/2020 | Li et al. | |
| 10,923,447 | B2 * | 2/2021 | Wirz | H10W 90/00 |
| 2007/0148816 | A1 | 6/2007 | Davis et al. | |
| 2014/0167254 | A1 * | 6/2014 | Yu | H10W 72/072 257/737 |
| 2017/0053960 | A1 * | 2/2017 | Wakiyama | H10F 39/809 |
| 2017/0323863 | A1 * | 11/2017 | Lee | H10W 70/05 |
| 2018/0342475 | A1 * | 11/2018 | Wirz | H10W 90/00 |
| 2021/0183773 | A1 * | 6/2021 | Rubin | H10W 70/611 |
| 2022/0310488 | A1 | 9/2022 | Fang et al. | |
| 2022/0384328 | A1 | 12/2022 | Kang et al. | |
| 2023/0070275 | A1 | 3/2023 | Bhat et al. | |
| 2023/0384367 | A1 | 11/2023 | Sun et al. | |
| 2025/0105212 | A1 * | 3/2025 | Huang | H10W 42/60 |
| 2026/0114298 | A1 | 4/2026 | Salmon et al. | |

OTHER PUBLICATIONS

Definition of "couple with" downloaded from URL <https://www.merriam-webster.com/dictionary/couple%20with> om May 5, 2026. (Year: 2026).*
International Search Report and Written Opinion for International Patent Application No. PCT/US2024/057007, mailed Mar. 20, 2025, 12 pages.
U.S. Appl. No. 18/919,934, filed Oct. 18, 2024.
U.S. Appl. No. 18/988,187, filed Dec. 19, 2024.

* cited by examiner

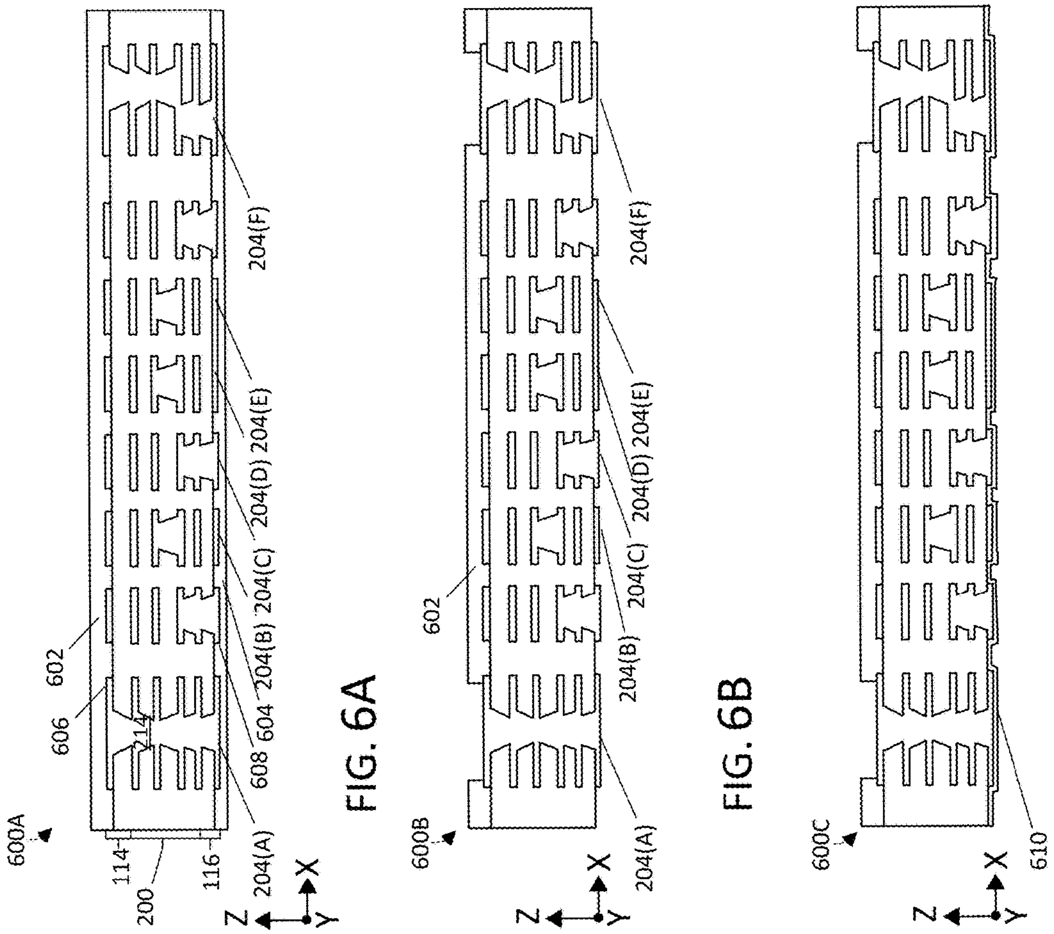
FIG. 6A
FIG. 6B
FIG. 6C
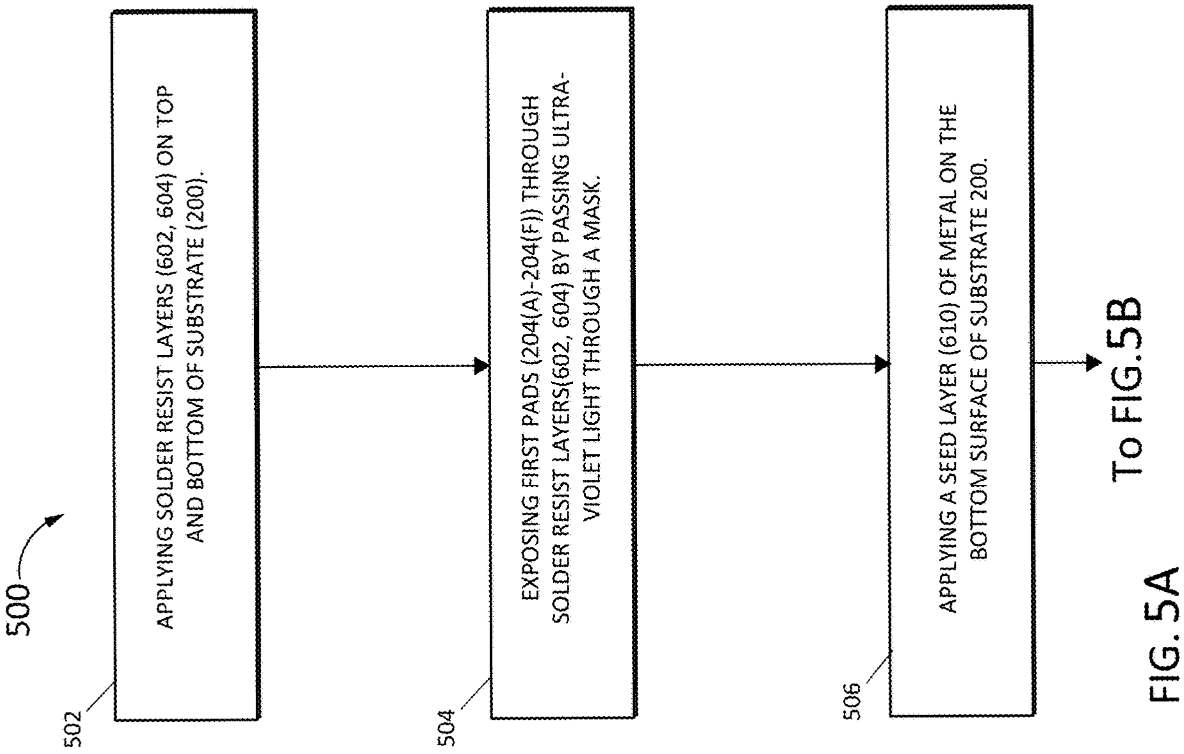
FIG. 5A

INTEGRATED CIRCUIT(IC) PACKAGE HAVING A SUBSTRATE EMPLOYING REDUCED AREA, ADDED METAL PAD(S) TO METAL INTERCONNECT(S) TO REDUCE DIE-SUBSTRATE CLEARANCE

BACKGROUND

I. Field of the Disclosure

The field of the disclosure relates to integrated circuit (IC) packages, and more particularly to design and manufacture of a substrate within an IC package to address thinning requirements.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The die(s) is electrically interfaced to metal interconnects (e.g., metal traces) exposed in a top layer of the package substrate. The package substrate also includes one or more metallization layers that include metal interconnects (e.g., metal traces, metal lines) with vertical interconnect accesses (vias) coupling the metal interconnects together between adjacent metallization layers to provide electrical interfaces between the die(s). The package substrate also includes a bottom, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the package to the PCB and interface its die(s) with the circuitry of the PCB. The die(s) may be mounted to the top layer of the package substrate through die interconnects. Other die(s) may also be mounted, utilizing die interconnects, to the bottom, outer metallization layer that includes metal interconnects between BGA interconnects.

SUMMARY

Aspects disclosed in the detailed description include an integrated circuit (IC) package having a substrate employing a reduced area, added metal pad(s) to metal interconnect(s) to reduce die-substrate clearance. The IC package includes a die that has die interconnects coupled to first metal pad(s) of respective metal interconnects of a metallization layer of the substrate (e.g., a package substrate) to provide support and signal routing paths. As an example, to facilitate a reduction in clearance between the die and the substrate and consequently reduce the height of the IC package, a second, additional metal pad(s) having a reduced cross-sectional area from the first metal pad(s) is coupled to the first metal pad(s). A solder joint(s) is employed to couple the second, additional metal pad(s) to a die interconnect(s) of the die to couple the die to the substrate. In this manner, as an example, when solder is heated to form the solder joint between the die interconnect and the second, additional metal pad, the solder flows along the reduced cross-sectional area of the second, additional metal pad(s) advantageously allowing a designer to control the clearance between the die and the substrate by either utilizing less solder, utilizing a shorter length of the corresponding die interconnect, or a combination of both.

In this regard in one aspect, an integrated circuit (IC) package, comprising a die, a substrate, and a solder joint. The die comprises a plurality of die interconnects. The substrate comprises a lower metallization layer extending in a first direction, the lower metallization layer comprising a plurality of metal interconnects. The plurality of metal interconnects comprising a first pad having a first surface and a second surface opposite the first surface in a second direction orthogonal to the first direction, the first pad having a first cross-sectional area extending in the first direction, and a second pad coupled to the first surface, the second pad having a second cross-sectional area extending in the first direction less than the first cross-sectional area. The solder joint coupled to the second pad and a first die interconnect of the plurality of die interconnects, the first die interconnect having a third cross-sectional area extending in the first direction and is less than the first cross-sectional area, the second cross-sectional area is at least equal to the third cross-sectional area.

In another aspect, a method for fabricating a substrate is disclosed. The method comprising forming a die comprising a plurality of die interconnects and forming a substrate comprising a lower metallization layer extending in a first direction, the lower metallization layer comprising a plurality of metal interconnects. The plurality of metal interconnects comprising a first pad having a first surface and a second surface opposite the first surface in a second direction orthogonal to the first direction. The first pad has a first cross-sectional area extending in the first direction. The method further comprises forming a second pad coupled to the first surface, the second pad having a second cross-sectional area extending in the first direction which is less than the first cross-sectional area. The method further comprising coupling a solder joint to the second pad and a first die interconnect of the plurality of die interconnects, the first die interconnect having a third cross-sectional area extending in the first direction less than the first cross-sectional area, the second cross-sectional area is at least equal to the third cross-sectional area.

BRIEF DESCRIPTION OF THE DRAWINGS

FIGS. 5A-5C is a flowchart illustrating another exemplary fabrication process of fabricating a substrate for an IC package, wherein the substrate employs a reduced area, added metal pad(s) to metal interconnect(s) to reduce die-substrate clearance including, but not limited to, the substrates in FIGS. 1, 2A, and 2B;

FIGS. 6A-6H are exemplary fabrication stages during fabrication of the substrate according to the fabrication process in FIGS. 5A-5C;

DETAILED DESCRIPTION

Figure 1:
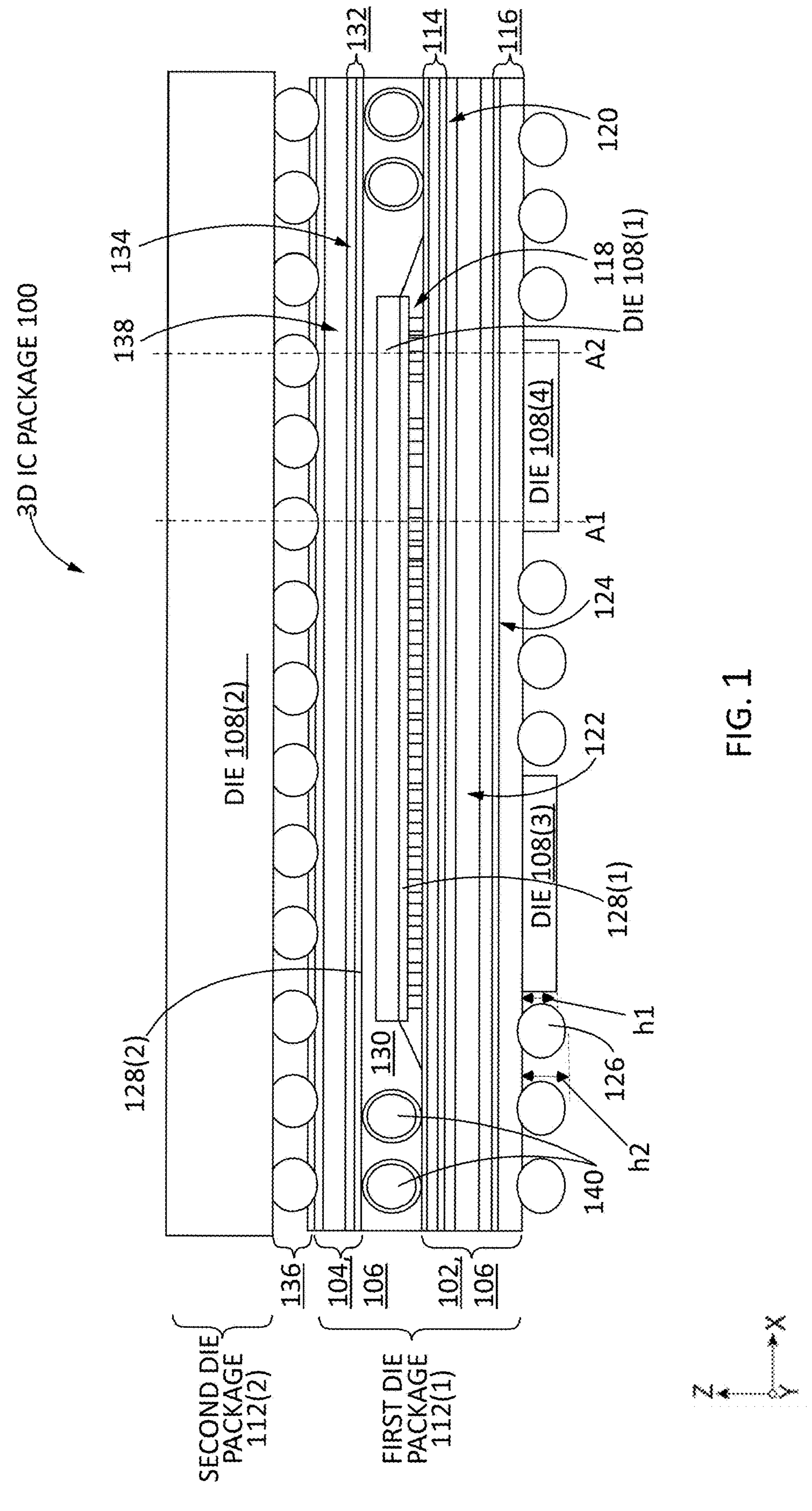
FIG. 1 is a side view of an exemplary three-dimensional (3D) integrated circuit (IC) (3DIC) package that includes a substrate employing a reduced area, added metal pad(s) to metal interconnect(s) to reduce die-substrate clearance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects. The term "adjacent" as used herein means spatially next to but not necessarily adjoining something as shown in the Figures unless specifically stated otherwise.

Aspects disclosed in the detailed description include an integrated circuit (IC) package having a substrate employing a reduced area, added metal pad(s) to metal interconnect(s) to reduce die-substrate clearance. The IC package includes a die that has die interconnects coupled to first metal pad(s) of respective metal interconnects of a metallization layer of the substrate (e.g., a package substrate) to provide support and signal routing paths. As an example, to facilitate a reduction in clearance between the die and the substrate and consequently reduce the height of the IC package, a second, additional metal pad(s) having a reduced cross-sectional area from the first metal pad(s) is coupled to the first metal pad(s). A solder joint(s) is employed to couple the second, additional metal pad(s) to a die interconnect(s) of the die to couple the die to the substrate. In this manner, as an example, when solder is heated to form the solder joint between the die interconnect and the second, additional metal pad, the solder flows along the reduced cross-sectional area of the second, additional metal pad(s) advantageously allowing a designer to control the clearance between the die and the substrate by either utilizing less solder, utilizing a shorter length of the corresponding die interconnect, or a combination of both.

In this regard, FIG. 1 is a side view of an exemplary IC package 100, which in this example is a three-dimensional (3D) IC (3DIC) package 100. The IC package 100 includes a package substrate 102 and an interposer substrate 104. The package substrate 102 and the interposer substrate 104 commonly route signals and power and, for convenience, may both be referred to simply as a substrate 106.

In this example, the IC package 100 includes first and second dies 108(1), 108(2) that are included in respective first and second die packages 112(1), 112(2) that are stacked on top of each other in the vertical direction (Z-axis direction). The first die package 112(1) of the IC package 100 includes the first die 108(1) coupled to the package substrate 102. In this example, the package substrate 102 includes a first, upper metallization layer 114. The first, upper metallization layer 114 provides an electrical interface for signal routing to the first die 108(1). The first die 108(1) is coupled to die interconnects 118 (e.g., raised metal bumps, pillars) that are electrically coupled to metal interconnects 120 in the first, upper metallization layer 114. The metal interconnects 120 in the first, upper metallization layer 114 are coupled to metal vias 122 (not visible) in the package substrate 102, which are coupled to metal interconnects 124 in a second, bottom metallization layer 116. In this manner, the package substrate 102 provides interconnections between its first and second metallization layers 114 and 116 to provide signal routing to the first die 108(1). External interconnects 126 (e.g., ball grid array (BGA) interconnects) are coupled to the metal interconnects 124 in the second, bottom metallization layer 116 to provide interconnections through the package substrate 102 to the first die 108(1) through the die interconnects 118. In this example, a first, active side 128(1) of the first die 108(1) is adjacent to and coupled to the package substrate 102, and more specifically the first, upper metallization layer 114 of the package substrate 102.

A third die 108(3) and fourth die 108(4) are attached to the bottom side of the first die package 112(1). The third die 108(3) and the fourth die 108(4) can be any silicon or gallium arsenide electrical device which has a back side that may be grindable. Typical widths in the z-direction of the third die 108(3) and the fourth die 108(4) are on the order of 100 microns. The third die 108(3) and the fourth die 108(4) include die connects (not shown) which couple to the metal interconnects 124 in the second, bottom metallization layer 116 and through reduced area, added metal pads (not shown) to reduce die-substrate clearance. The effect of this clearance as shown in FIG. 1 is that a height, h1, of the dies 108(3) and 108(4) is smaller than a height, h2 of the external interconnects 126. The reduced area, added metal pads will be discussed further in connection with FIGS. 2A-2B and 3.

In the exemplary IC package 100 in FIG. 1, an additional optional second die package 112(2) is provided and coupled to the first die package 112(1) to support multiple dies. For example, the first die 108(1) in the first die package 112(1) may include an application processor, and the second die 108(2) may be a memory die, such as a dynamic random access memory (DRAM) die that provides memory support for the application processor. In this regard, in this example, the first die package 112(1) also includes the interposer substrate 104 that is disposed on a package mold 130 encasing the first die 108(1), adjacent to a second, inactive side 128(2) of the first die 108(1). The interposer substrate 104 also includes one or more metallization layers 132 that each include metal interconnects 134 to provide interconnections to the second die 108(2) in the second die package 112(2). The second die package 112(2) is physically and electrically coupled to the first die package 112(1) by being coupled through external interconnects 136 (e.g., solder bumps, BGA interconnects) to the interposer substrate 104. The external interconnects 136 are coupled to the metal interconnects 134 in the interposer substrate 104 through metal vias 138 (not visible). The first die package 112(1) includes vertical interconnects 140 to couple the second die

108(2) to the external interconnects 126 and to the first die 108(1) through the package substrate 102.

Figure 2A:
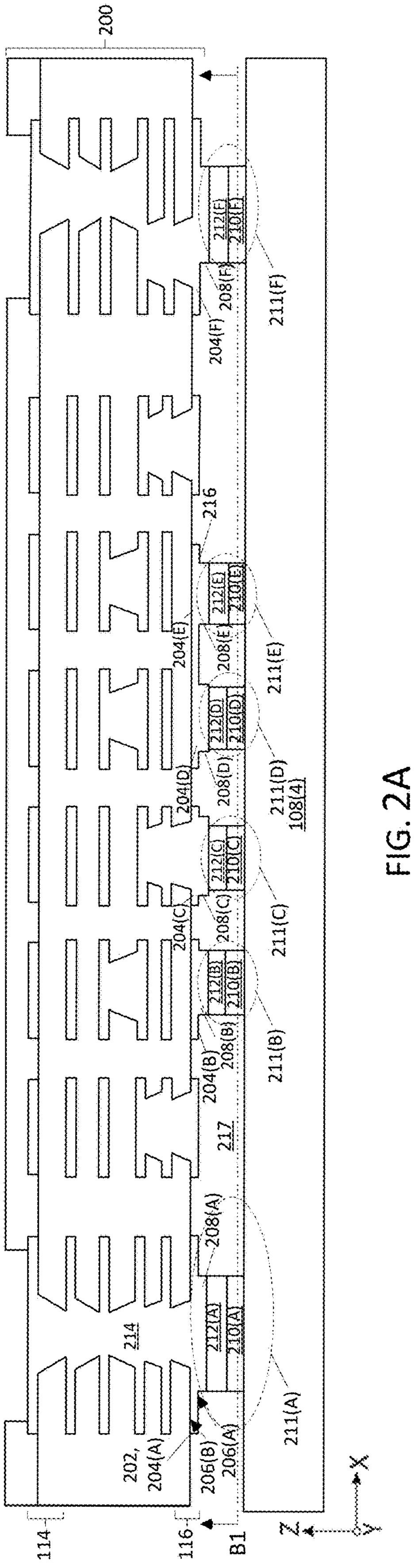
FIG. 2A is side view of one substrate embodiment of the exemplary substrate shown in FIG. 1 between cut lines A1 and A2, employing a reduced area, added metal pad(s) to metal interconnect(s) to reduce die-substrate clearance.

FIG. 2A is a side view of one substrate embodiment of the exemplary substrate 106 shown in FIG. 1 between cut lines A1 and A2, employing a reduced area, added metal pad(s) to metal interconnect(s) to reduce die-substrate clearance. Substrate 200 includes the upper metallization layer 114 and bottom metallization layer 116, each metallization layer extending in a first, horizontal direction (X-, Y-axes direction).

The bottom metallization layer 116 includes a metal interconnect 202. The metal interconnect 202 is also a first pad 204(A) having a first surface 206(A) and a second surface 206(B) opposite the first surface 206(A) in a second direction orthogonal to the first direction (Z-axis direction). The first pad 204(A) has a first cross-sectional area extending in the first, horizontal direction (X-, Y-axes direction). First pads 204(A)-204(F) are formed in the last metal layer of the substrate 200. An added second pad 208(A) is coupled to the first surface 206(A) and has a second cross-sectional area extending in the first, horizontal direction (X-, Y-axes direction). The second cross-sectional area is less than the first cross-sectional area. The second pad 208(A) has a height in the second, vertical direction (Z-axis direction) of 10 micrometers (μm). The height of the second pad 208(A) may be larger depending on the desired clearance level objective.

The die 108(4) includes die interconnects 210(A)-210(F) and solder joints 212(A)-212(F). Solder joint 212(A) is coupled to the second pad 208(A) and die interconnect 210(A). The solder joint 212(A) has a height in the second, vertical direction (Z-axis direction) of less than 30 μm. The die interconnect 210(A) has a height in the second, vertical direction (Z-axis direction) of 12 μm which was reduced from 37 μm. The die interconnect 210(A) has a third cross-sectional area extending in the first, horizontal direction (X-, Y-axes direction). The third cross-sectional area is less than the first cross-sectional area. The second cross-sectional area is at least equal to the third cross-sectional area. In particular, the second cross-sectional area may be larger than the third cross-sectional area by an amount to ensure alignment between the solder joint 212(A) and the second pad 208(A) during assembly of the IC package 100. A die-substrate coupling, such as die couplings 211(A)-211(F), refers to a die interconnect 210, solder joint 212, second pad 208, and first pad 204 combination in the second, vertical direction (Z-axis direction) such as die interconnect 210(A), solder joint 212(A), second pad 208(A), and first pad 204(A). Also, a mold compound 217 fills up the space between the die-substrate couplings 211(A)-211(F).

Substrate layout and design may impose different design rule constraints on the minimal cross-sectional area of respective first pads 204(A)-204(F) and will be discussed in connection with FIG. 3.

Figure 2B:
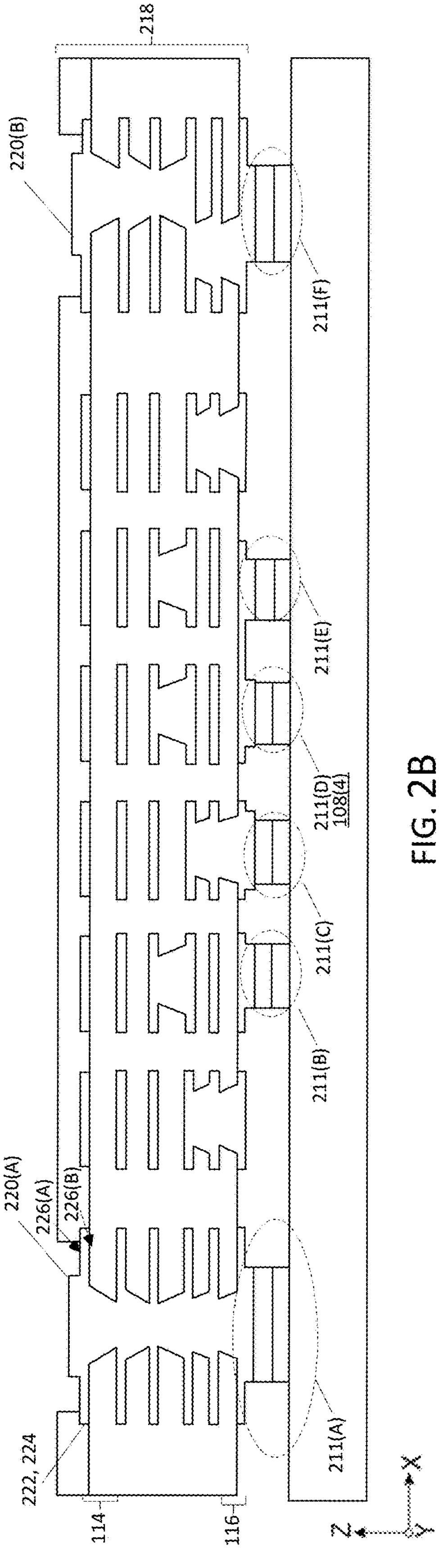
FIG. 2B is side view of another substrate embodiment of the exemplary substrate shown in FIG. 1 between cut lines A1 and A2, employing a reduced area, added metal pad(s) to metal interconnect(s) to reduce die-substrate clearance.

FIG. 2B is a side view of another substrate embodiment of the exemplary substrate 106 shown in FIG. 1 between cut lines A1 and A2, employing a reduced area, added metal pad(s) to metal interconnect(s) to reduce die-substrate clearance. Substrate 218 is the same as the substrate 200 in FIG. 2A including the same die-substrate couplings 211(A)-211(F) except that the upper metallization layer 114 in the substrate 218 contains added second pads such as second pads 220(A) and 220(B).

The upper metallization layer 114 in the substrate 218 includes a metal interconnect 222. The metal interconnect 222 is also known as a first pad 224 which has a first surface 226(A) and a second surface 226(B) opposite the first surface in a second direction orthogonal to the first direction (Z-axis direction). The first pad 224 has a fourth cross-sectional area extending in the first, horizontal direction (X-, Y-axes direction). The second pad 220(A) is coupled to the first surface 226(A) and has a fifth cross-sectional area extending in the first, horizontal direction (X-, Y-axes direction). The fifth cross-sectional area of the second pad 220(A) is less than the fourth cross-sectional area of the first pad 224. Although not shown, the second pad 220(A) can receive solder to couple another die such as die 108(1) through one of the die interconnects 118. Exemplary cross-sectional areas mentioned above will be discussed further in connection with FIG. 3. FIGS. 2A and 2B are shown with a solder resist layer having been removed during fabrication. The solder resist layer would be adjacent to the bottom metallization layer 116.

Figure 3:
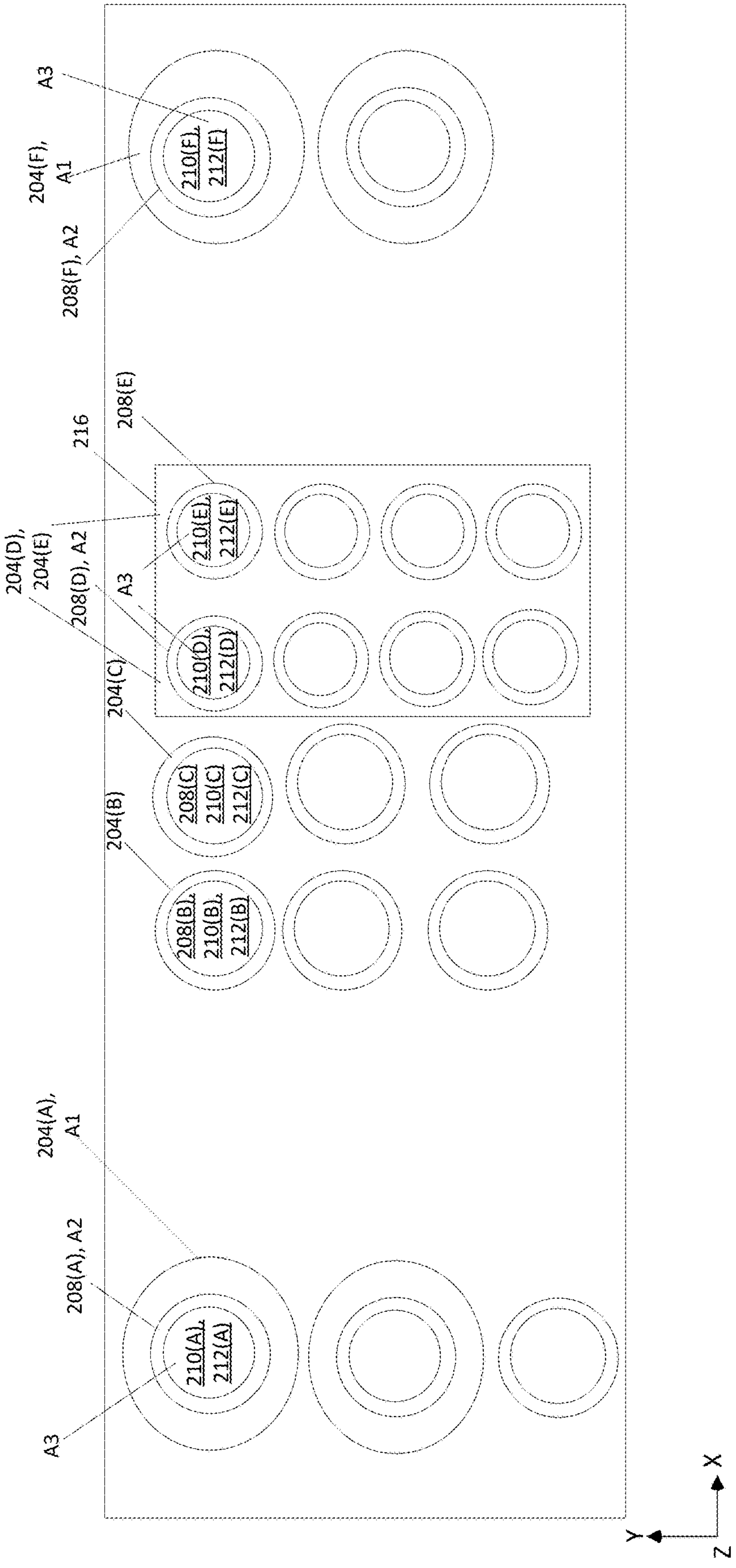
FIG. 3 is a perspective view of the substrate in FIG. 2A in the positive Z-direction from cut line B1 in FIG. 2A.

FIG. 3 is a perspective view of the substrate 200 in FIG. 2A in the positive Z-direction from cut line B1 in FIG. 2A. Substrate configuration and design may impose minimum size constraints on the first pads 204(A)-204(F) including cross-sectional area constraints. For example, first pad 204(A) is coupled to a via 214 (see FIG. 2A), the width of the via in the X, Y direction limits the cross sectional area of the first pad 204(A). As such, the first pad 204(A) has a diameter, d1, of 90 μm and, thus, a first cross-sectional area, A1=$\pi(0.5d1)^2$ or 45π μm$^2$. To limit extraneous solder flow, second pad 208(A) has a diameter, d2, of 60 μm and, thus, a second cross-sectional area, A2 or 30π μm$^2$. Die interconnect 210(A) and solder joint 212(A) have a diameter of 50 μm and, thus, a third cross-sectional area, A3 or 25π μ m$^2$.

As another example, first pads 204(B) and 204(C) have the smallest minimum size imposed by the substrate configuration and design. As such, the first pads 204(B) and 204(C) have a diameter, d1, of 80 μm and, thus, a first cross-sectional area, A1=$\pi(0.5d1)^2$ or 40π μm$^2$. To limit extraneous solder flow, second pads 208(B) and 208(C) have a diameter, d2, of 50 μm and, thus, a second cross-sectional area, A2 or 25π μm$^2$. Die interconnects 210(B) and 210(C) and solder joints 212(B) and 212(C) have a diameter of 50 μm and, thus, a third cross-sectional area, A3 or 25π μ m$^2$.

As another example, first pads 204(D) and 204(E) are coupled in the first horizontal direction (X-,Y-axes direction) to form a plane 216 that may be connected to ground when the IC package 100 is deployed in a device. The plane 216 is coupled to multiple second pads including second pads 208(D) and 208(E), and has a cross-sectional area different than the cross-sectional area of the first pad 204(A). The second pads 208(D) and 208(E) have a diameter, d2, of 55 μm and, thus, a second cross-sectional area, A2 or 27.5π μm$^2$. Die interconnects 210(D) and 210(E) and solder joints 212(D) and 212(E) have a diameter of 50 μm and, thus, a third cross-sectional area, A3 or 25π μm$^2$. By providing a second pad whose cross-sectional area is less than the cross-sectional area of a corresponding first pad and is equal to or slightly larger than the cross-sectional area of a corresponding die interconnect/solder joint, a substrate designer can control the clearance between the die and the substrate by utilizing less solder, utilizing a shorter length of the corresponding die interconnect, or a combination of both. For example, by adding a second pad whose height in the second, vertical direction (Z-axis direction) is 10 μm, the die interconnect has been reduced from 37 μm to 12 μm, reducing the clearance between the substrate and the die by 15 μm (37 μm−(12 μm+10 μm)).

Please note that FIG. 3 illustrates the die-substrate couplings as concentric circles. However, depending on fabrication tooling, these cross-sectional areas may be any shape including square, rectangle, quadrangle, ovals, and the like.

Figure 4:
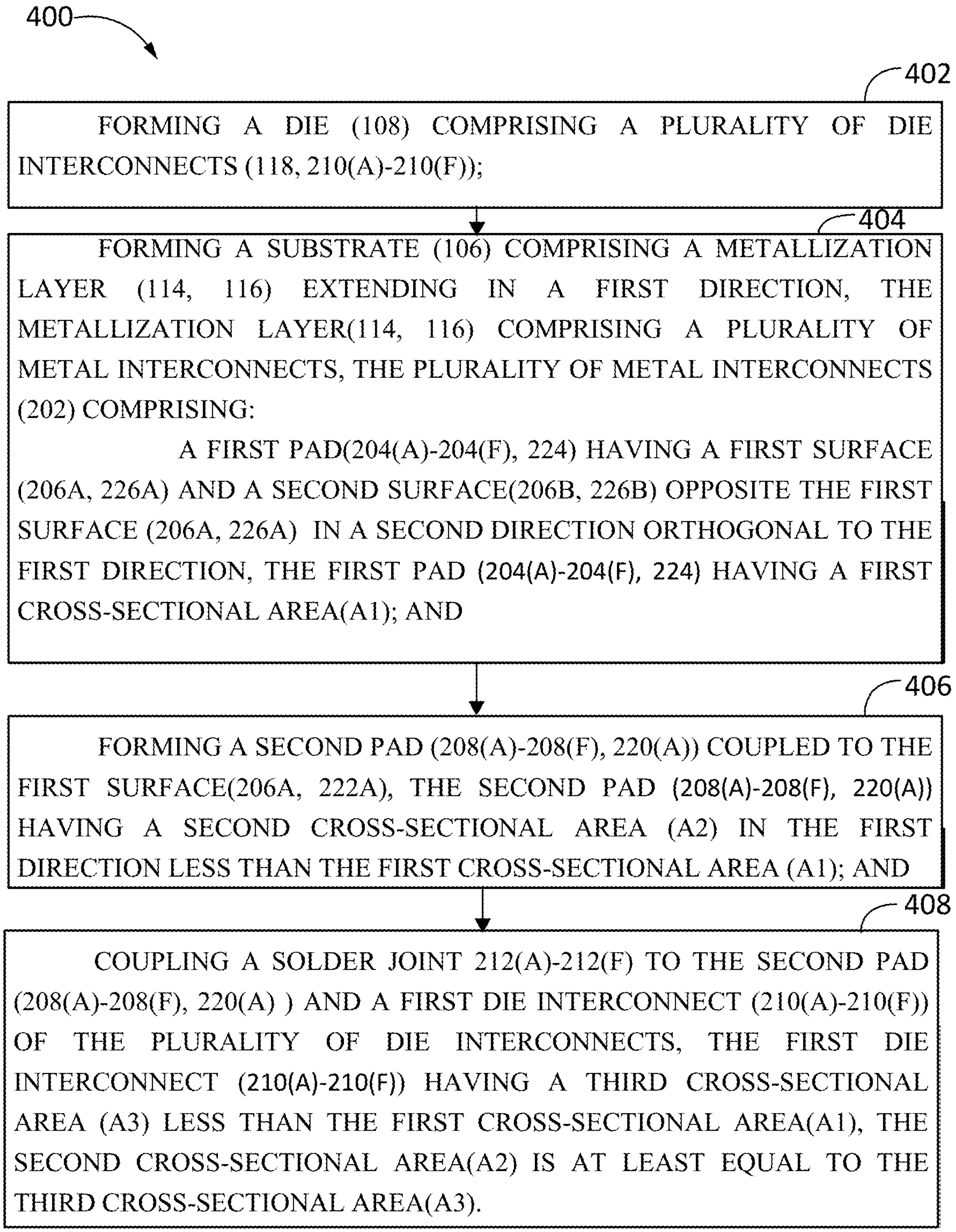
FIG. 4 is a flowchart illustrating an exemplary fabrication process of fabricating a substrate for an IC package such as the substrates described in FIGS. 1, 2A, and 2B, wherein the substrate employs a reduced area, added metal pad(s) to metal interconnect(s) to reduce die-substrate clearance, including, but not limited to, the substrates in FIGS. 1, 2A, and 2B.

A substrate employing a reduced area, added metal pad(s) to metal interconnect(s) to reduce die-substrate clearance, including, but not limited to, the substrates 106, 200, and 218 in FIGS. 1, 2A, and 2B in the related IC package 100 in FIG. 1 can be fabricated by different fabrication processes. FIG. 4 is a flowchart illustrating an exemplary fabrication process 400 of fabricating a substrate for an IC package such as the substrates described in FIGS. 1, 2A, and 2B, wherein the substrate employs a reduced area, added metal pad(s) to metal interconnect(s) to reduce die-substrate clearance, including, but not limited to, the substrates in FIGS. 1, 2A, and 2B.

In this regard, a first exemplary step in the fabrication process 400 of FIG. 4 can include forming a die 108 comprising a plurality of die interconnects 118, 210(A)-210(F) (block 402 in FIG. 4). A next step in the fabrication process 400 can include forming a substrate 106 comprising a metallization layer 114, 116 extending in a first direction, the metallization layer 114, 116 comprising a plurality of metal interconnects 202. The metal interconnects 202 comprise a first pad 204(A)-204(F), 224 having a first surface 206(A), 226(A) and a second surface 206(B), 226(B) opposite the first surface 206(A), 226(A) in a second direction orthogonal to the first direction, the first pad 204(A)-204(F), 224 having a first cross-sectional area A1 (block 404 in FIG. 4). A next step in the fabrication process 400 can include forming a second pad 208(A)-208(F), 220(A) coupled to the first surface 206(A), 226(A), the second pad 208(A)-208(F), 220(A) having a second cross-sectional area A2 in the first direction less than the first cross-sectional area A1 (block 406 in FIG. 4). A next step in the fabrication process 400 can include coupling a solder joint 212(A)-212(F) to the second pad 208(A)-208(F) and a first die interconnect 210(A)-210(F) of the plurality of die interconnects, the first die interconnect 210(A)-210(F) having a third cross-sectional area A3 less than the respective first cross-sectional area A1, the respective second cross-sectional area A2 is at least equal to the third cross-sectional area A3 (block 406 in FIG. 4).

Figure 5B:
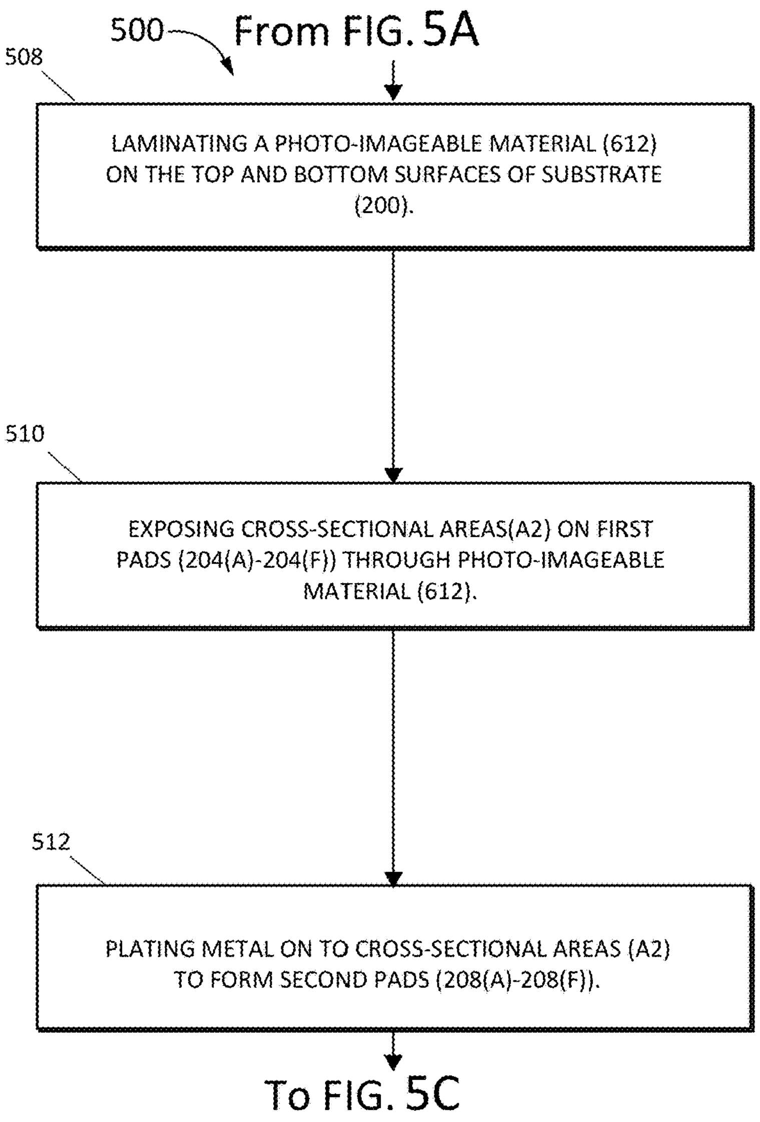
Figure 5C:
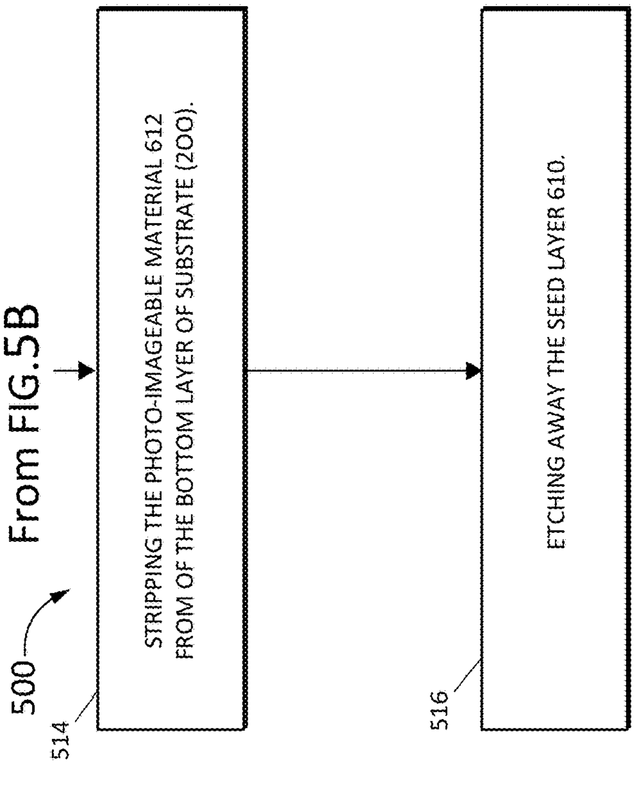

Other fabrication processes can also be employed to fabricate a substrate employing a reduced area, added metal pad(s) to metal interconnect(s) to reduce die-substrate clearance, including, but not limited to, the substrates 106, 200 and 218 in FIGS. 1, 2A, and 2B in the related IC package 100 in FIG. 1. In this regard, FIGS. 5A-5C is a flowchart illustrating another exemplary fabrication process of fabricating a substrate for an IC package, wherein the substrate employs a reduced area, added metal pad(s) to metal interconnect(s) to reduce die-substrate clearance including, but not limited to, the substrates in FIGS. 1, 2A, and 2B. FIGS. 6A-6H are exemplary fabrication stages during fabrication of the substrate according to the fabrication process in FIGS. 5A-5C. The fabrication process 500 as shown in the fabrication stages 600A-600H in FIGS. 6A-6H are in reference to the substrate 200 in FIG. 2 and the related IC package 100 in FIG. 1, and thus will be discussed with reference to the substrate 200 and related IC package 100 in FIGS. 1 and 2A.

Figure 6D:
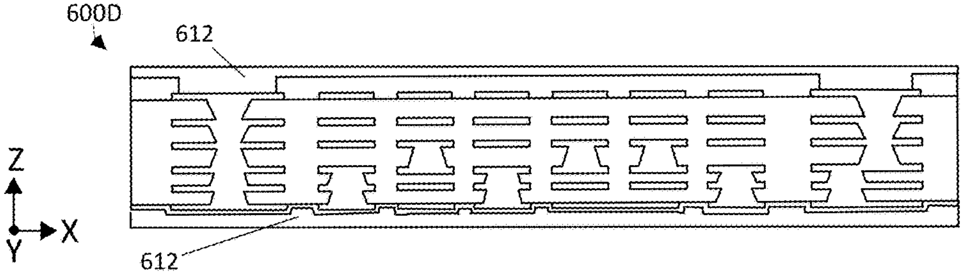
Figure 6E:
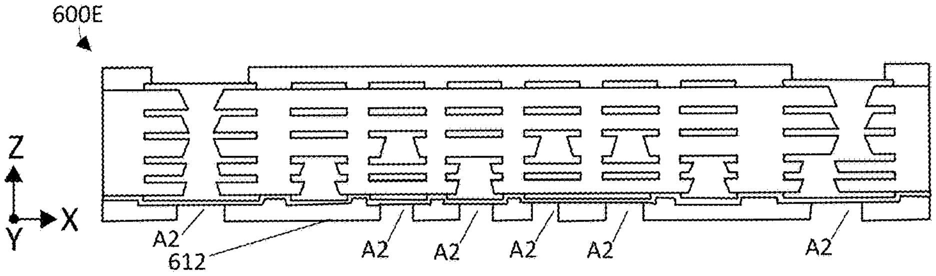
Figure 6F:
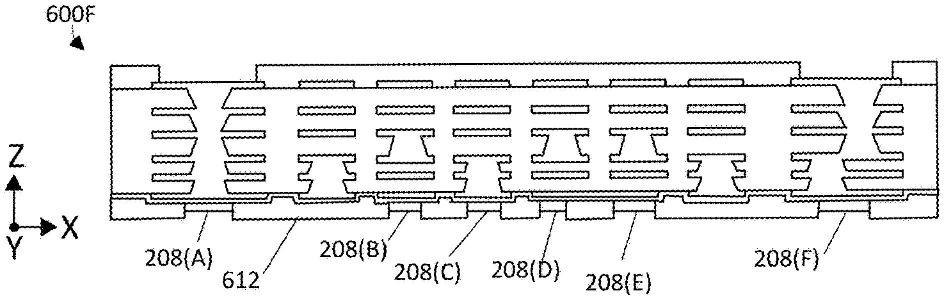
Figure 6G:
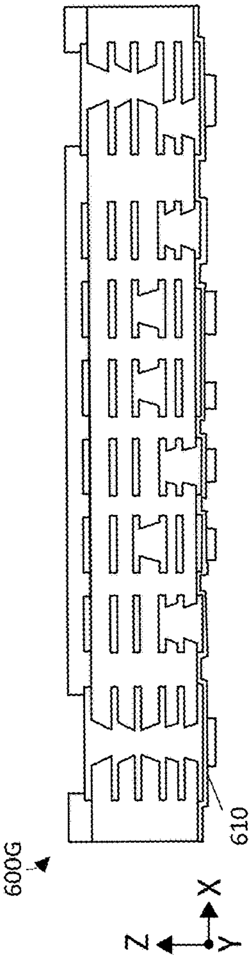
Figure 6H:
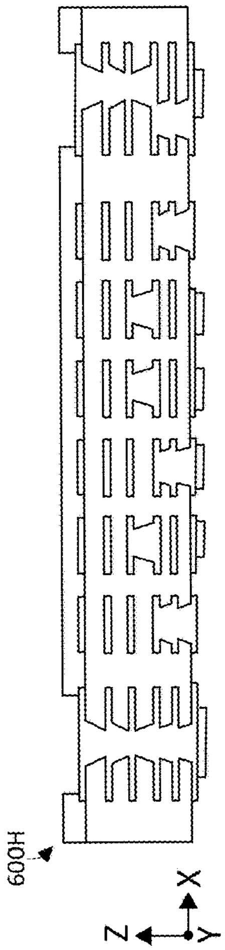

In this regard, as shown in fabrication stage 600A in FIG. 6A, an exemplary step in the fabrication process 500 is to apply solder resist layers 602, 604 on the substrate 200 (block 502 in FIG. 5A). The substrate 200, as shown, has been fabricated utilizing conventional techniques with multiple metallization layers including the metallization layers 114 and 116, metal interconnects such as first pads 204(A)-204(F), and routing paths from a top surface 606 of the substrate 200 to a bottom surface 608 of the substrate 200 including the via 214. As shown at fabrication stage 600B in FIG. 6B, a next step in the fabrication process 500 can include exposing the first pads 204(A)-204(F) through the solder resist layers 602, 604 by passing ultra-violet light through a mask (block 504 in FIG. 5A). As shown at fabrication stage 600C in FIG. 6C, a next step in the fabrication process 500 can include applying a seed layer 610 of metal (e.g., copper (Cu)) on the bottom surface 608 of the substrate 200 (block 506 in FIG. 5A). As shown at fabrication stage 600D in FIG. 6D, a next step in the fabrication process 500 can include laminating a photo-imageable material 612, such as a dry film, on the top and bottom surfaces 606, 608 of the substrate 200 (block 508 in FIG. 5B). As shown at fabrication stage 600E in FIG. 6E, a next step in the fabrication process 500 can include exposing cross-sectional areas A2 on the first pads 204(A)-204(F) through the photo-imageable material 612 (block 510 in FIG. 5B). Please note that the cross-sectional areas A2 refer to the eventual cross area of the respective second pads and may vary depending on the which first pads of the first pads 204(A)-204(F) are exposed. As shown at fabrication stage 600F in FIG. 6F, a next step in the fabrication process 500 can include plating metal (e.g., Cu) on to the cross-sectional areas A2 of the first pads 204(A)-204(F) to form second pads 208(A)-208(F) (block 512 in FIG. 5B). As shown at fabrication stage 600G in FIG. 6G, a next step in the fabrication process 500 can include stripping the photo-imageable material 612 from the bottom layer of the substrate 200 (block 514 in FIG. 5C). As shown at fabrication stage 600H in FIG. 6H, a next step in the fabrication process 500 can include etching away the seed layer 610 using a chemical etch (block 516 in FIG. 5C). The substrate 200, after completion of the fabrication process 500, may be assembled with a die to form die-substrate couplings 211(A)-211(F).

Electronic devices that include an IC package, wherein the IC package includes a substrate(s) employing a reduced area, added metal pad(s) to metal interconnect(s) to reduce die-substrate clearance, including, but not limited to, the substrates in FIGS. 1, 2A, and 2B and according to the exemplary fabrication processes in FIGS. 4 and 5A-5C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, and a multicopter.

Figure 7:
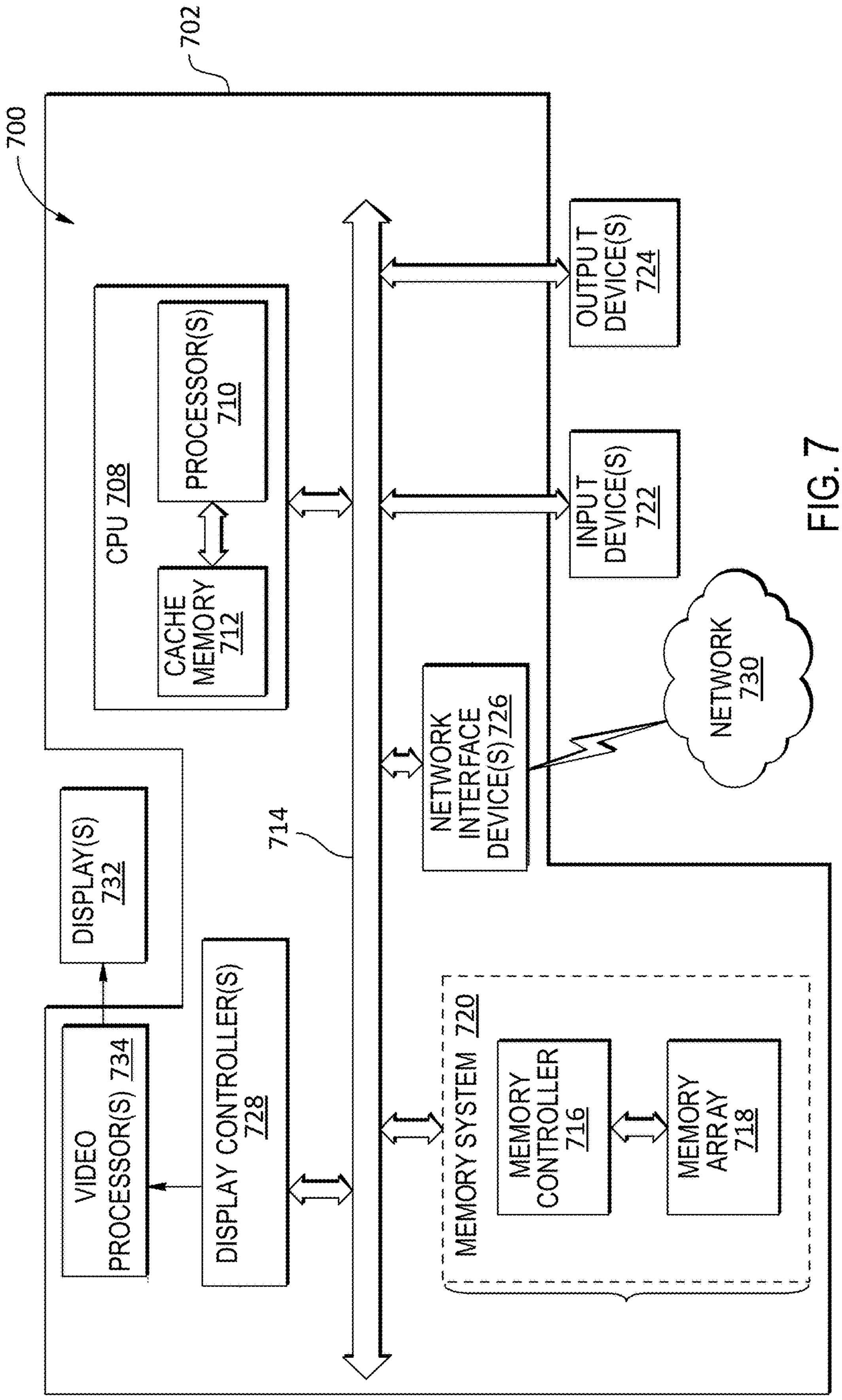
FIG. 7 is a block diagram of an exemplary processor-based system that can include components deployed in an IC package, wherein the IC package includes a substrate(s) employing a reduced area, added metal pad(s) to metal interconnect(s) to reduce die-substrate clearance, including, but not limited to, the substrate(s) in FIGS. 1, 2A, and 2B and according to the exemplary fabrication processes in FIGS. 4 and 5A-5C.

In this regard, FIG. 7 is a block diagram of an exemplary processor-based system that can include components deployed in an IC package, wherein the IC package includes a substrate(s) employing a reduced area, added metal pad(s) to metal interconnect(s) to reduce die-substrate clearance, including, but not limited to, the substrates in FIGS. 1, 2A, and 2B and according to the exemplary fabrication processes in FIGS. 4 and 5A-5C, and according to any exemplary aspects disclosed herein. In this example, the processor-based system 700 may be formed as an IC package 702 such as the IC package 100 in FIG. 1 utilizing the substrates 200, 218 or a combination of both substrates. The processor-based system 700 includes a central processing unit (CPU) 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716, as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. Each of the memory system(s) 720, the one or more input devices 722, the one or more output devices 724, the one or more network interface devices 726, and the one or more display controllers 728 can be provided in the same or different electronic devices. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processor(s) 734, which process the information to be displayed into a format suitable for the display(s) 732. The display controller(s) 728 and video processor(s) 734 can be included as ICs in the same or different electronic devices, and in the same or different electronic devices containing the CPU 708, as an example. The display(s) 732 can include any type of display, including, but not limited to, a cathode ray tube (CRT), a liquid crystal display (LCD), a plasma display, a light emitting diode (LED) display, etc.

Figure 8:
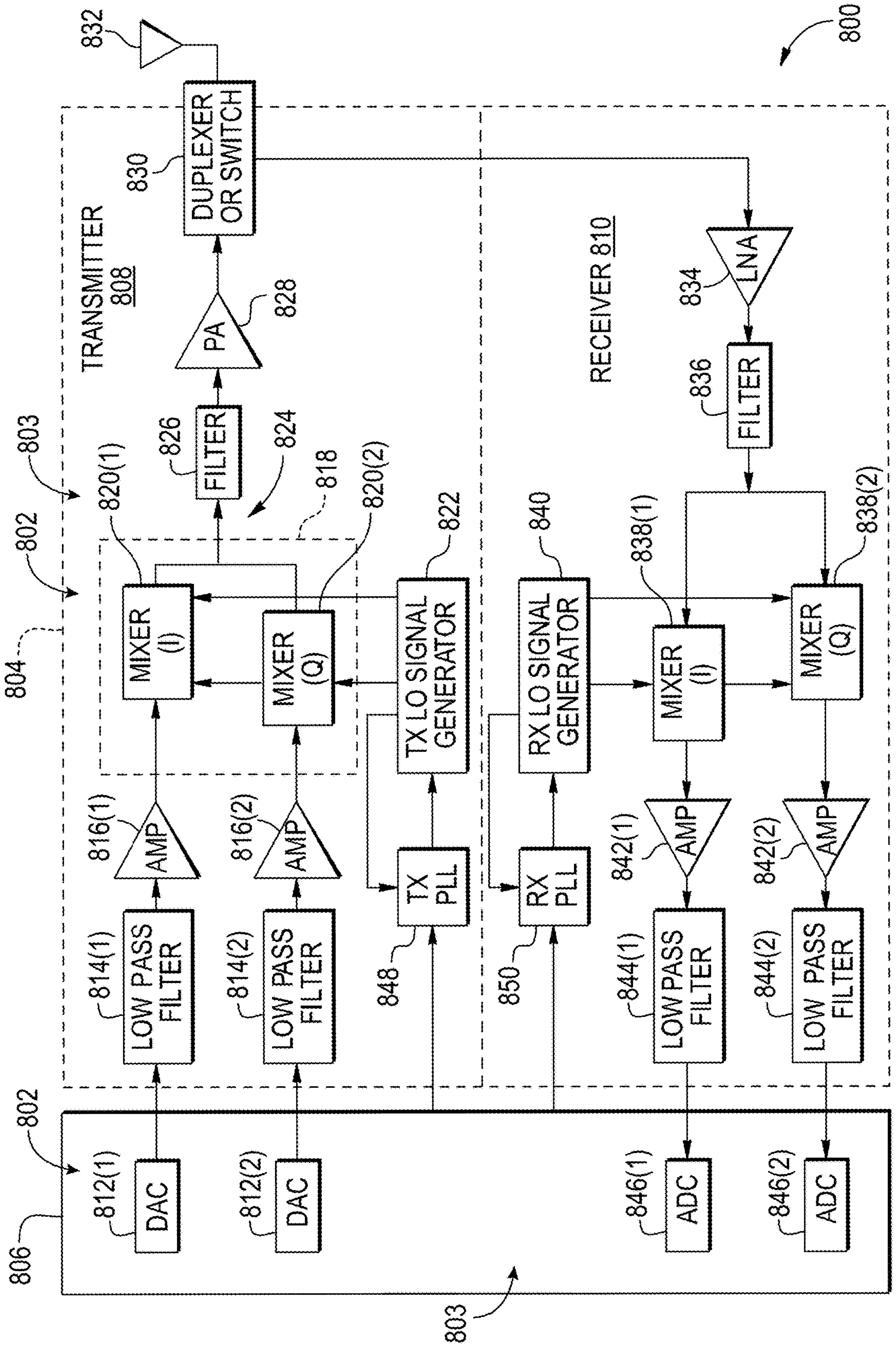
FIG. 8 is a block diagram of an exemplary wireless communications device that includes radio-frequency (RF) components deployed in an IC package, wherein the IC package includes a substrate(s) employing a reduced area, added metal pad(s) to metal interconnect(s) to reduce die-substrate clearance, including, but not limited to, the substrate(s) in FIGS. 1, 2A, and 2B and according to the exemplary fabrication processes in FIGS. 4 and 5A-5C.

FIG. 8 illustrates an exemplary wireless communications device 800 that includes radio-frequency (RF) components formed from one or more ICs 802, wherein any of the ICs 802 can be deployed in an IC package 803 wherein the IC package 803 includes a substrate(s) employing a reduced area, added metal pad(s) to metal interconnect(s) to reduce die-substrate clearance, including, but not limited to, the substrates in FIGS. 1, 2A, and 2B and according to the exemplary fabrication processes in FIGS. 4 and 5A-5C, and according to any exemplary aspects disclosed herein. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals (e.g., I and Q output currents) for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency up-conversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Down-conversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency up-conversion, while the RX LO signal generator 840 generates the I and Q RX LO signals used for frequency down-conversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
   - a die comprising a plurality of die interconnects; and
   - a substrate comprising a lower metallization layer extending in a first direction,
     - the lower metallization layer comprising a plurality of metal interconnects,
     - the plurality of metal interconnects comprising:
     - a first pad having a first surface and a second surface opposite the first surface in a second direction orthogonal to the first direction, the first pad having a first cross-sectional area extending in the first direction; and
     - a second pad coupled to the first surface, the second pad having a second cross-sectional area extending in the first direction less than the first cross-sectional area; and
   - a solder joint coupled to the second pad and a first die interconnect of the plurality of die interconnects, the first die interconnect having a third cross-sectional area extending in the first direction less than the first cross-sectional area, the second cross-sectional area is at least equal to the third cross-sectional area.
2. The IC package of clause 1,
   - wherein the substrate further comprising:
     - an upper metallization layer extending in the first direction, the upper metallization layer comprising a second plurality of metal interconnects, the second plurality of metal interconnects comprising:

a second first pad having a fourth cross-sectional area extending in the first direction and a third surface extending in the first direction; and wherein the IC package further comprises:

a second second pad extending in the first direction and adjacent to the third surface, the second second pad having a fifth cross-sectional area extending in the first direction and less than the fourth cross-sectional area; and a second solder joint coupled to the second second pad and a second die interconnect of the plurality of die interconnects, the second die interconnect having a sixth cross-sectional area extending in the first direction and less than the fourth cross-sectional area, the sixth cross-sectional is less than or equal to the fifth cross-sectional area.

3. The IC package of clause 1, wherein:

the plurality of metal interconnects further comprises:

a second first pad having a fourth cross-sectional area extending in the first direction and a third surface extending in the first direction; and the IC package further comprises:

a second second pad extending in the first direction and adjacent to the third surface, the second second pad having a fifth cross-sectional area extending in the first direction less than the fourth cross-sectional area; and a second solder joint coupled to the second second pad and a second die interconnect of the plurality of die interconnects, the second die interconnect having a sixth cross-sectional area extending in the first direction less than the fourth cross-sectional area, the sixth cross-sectional is less than or equal to the fifth cross-sectional area.

4. The IC package of clause 2 or 3, wherein the first cross-sectional area is equal to the fourth cross-sectional area, the second cross-sectional area is equal to the fifth cross-sectional area, and the third cross-sectional area is equal to the sixth cross-sectional area.

5. The IC package of clause 3, wherein the first pad and the second first pad are coupled in the first direction to form a plane.

6. The IC package of clause 1, wherein the second cross-sectional area is equal to or less than 30π square micrometers ($\mu m^2$).

7. The IC package of clause 1, wherein the first die interconnect of the plurality of die interconnects has a first height less than 37 micrometers (μm).

8. The IC package of clause 6, wherein the solder joint has a second height of less than 30 μm.

9. The IC package of clause 7, wherein the second pad has a third height of at least 10 μm.

10. The IC package of any of clauses 1 and 3-9 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; and a multicopter.

11. A method for fabricating a substrate, comprising:

forming a die comprising a plurality of die interconnects;

forming a substrate comprising a lower metallization layer extending in a first direction, the lower metallization layer comprising a plurality of metal interconnects, the plurality of metal interconnects comprising:

a first pad having a first surface and a second surface opposite the first surface in a second direction orthogonal to the first direction, the first pad having a first cross-sectional area extending in the first direction;

forming a second pad coupled to the first surface, the second pad having a second cross-sectional area extending in the first direction less than the first cross-sectional area; and coupling a solder joint to the second pad and a first die interconnect of the plurality of die interconnects, the first die interconnect having a third cross-sectional area extending in the first direction less than the first cross-sectional area, the second cross-sectional area is at least equal to the third cross-sectional area.

12. The method of clause 11, wherein the second cross-sectional area is larger than the third cross-sectional area by an amount to ensure alignment between the solder joint and the second pad.

13. The method of clause 11, wherein:

the plurality of metal interconnects further comprises:

a second first pad having a fourth cross-sectional area extending in the first direction and a third surface extending in the first direction; and the method further comprises:

forming a second second pad extending in the first direction and adjacent to the third surface, the second second pad having a fifth cross-sectional area extending in the first direction less than the fourth cross-sectional area; and coupling a second solder joint to the second second pad and a second die interconnect of the plurality of die interconnects, the second die interconnect having a sixth cross-sectional area extending in the first direction less than the fourth cross-sectional area, the sixth cross-sectional area matches the fifth cross-sectional area.

14. The method of clause 13, wherein the first cross-sectional area is equal to the fourth cross-sectional area, the second cross-sectional area is equal to the fifth cross-sectional area, and the third cross-sectional area is equal to the sixth cross-sectional area.

15. The method of clause 13, wherein the first pad and the second first pad are coupled in the first direction to form a plane.

16. The method of any of clauses 11-15, wherein the second cross-sectional area is equal to or less than 30π square micrometers ($\mu m^2$).

17. The method of any of clauses 11-16, wherein the first die interconnect of the plurality of die interconnects has a first height less than 37 micrometers (μm).

18. The method of any of clauses 11-17, wherein the solder joint has a second height of less than 30 μm.

19. The method of any of clauses 11-18, wherein the second pad has a third height of at least 10 μm.

What is claimed is:

1. An integrated circuit (IC) package, comprising:
a die comprising a plurality of die interconnects; and
a substrate comprising a lower metallization layer extending in a first direction, the lower metallization layer comprising a plurality of metal interconnects, the plurality of metal interconnects comprising:
a first pad having a first surface and a second surface opposite the first surface in a second direction orthogonal to the first direction, the first pad having a first cross-sectional area extending in the first direction; and
a second pad coupled to the first surface, the second pad having a second cross-sectional area extending in the first direction less than the first cross-sectional area; and
a solder joint coupled to the second pad and a first die interconnect of the plurality of die interconnects, the first die interconnect having a third cross-sectional area extending in the first direction less than the first cross-sectional area, the second cross-sectional area is at least equal to the third cross-sectional area;
wherein the substrate further comprises:
an upper metallization layer extending in the first direction, the upper metallization layer comprising a second plurality of metal interconnects, the second plurality of metal interconnects comprising:
a second first pad having a fourth cross-sectional area extending in the first direction and a third surface extending in the first direction; and
wherein the IC package further comprises:
a second second pad extending in the first direction and adjacent to the third surface, the second second pad having a fifth cross-sectional area extending in the first direction and less than the fourth cross-sectional area; and
a second solder joint coupled to the second second pad and a second die interconnect of the plurality of die interconnects, the second die interconnect having a sixth cross-sectional area extending in the first direction and less than the fourth cross-sectional area, the sixth cross-sectional area is less than or equal to the fifth cross-sectional area.

2. The IC package of claim 1, wherein the first cross-sectional area is equal to the fourth cross-sectional area, the second cross-sectional area is equal to the fifth cross-sectional area, and the third cross-sectional area is equal to the sixth cross-sectional area.

3. The IC package of claim 1, wherein the first pad and the second first pad are coupled in the first direction to form a plane.

4. The IC package of claim 1, wherein the second cross-sectional area is equal to or less than 30$\pi$ square micrometers ($\mu m^2$).

5. The IC package of claim 1, wherein the first die interconnect of the plurality of die interconnects has a first height less than 37 micrometers ($\mu$m).

6. The IC package of claim 4, wherein the solder joint has a second height of less than 30 $\mu$m.

7. The IC package of claim 5, wherein the second pad has a third height of at least 10 $\mu$m.

8. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; and a multicopter.

9. A method for fabricating a substrate, comprising:
forming a die comprising a plurality of die interconnects;
forming the substrate comprising a lower metallization layer extending in a first direction, the lower metallization layer comprising a plurality of metal interconnects, the plurality of metal interconnects comprising:
a first pad having a first surface and a second surface opposite the first surface in a second direction orthogonal to the first direction, the first pad having a first cross-sectional area extending in the first direction;
forming a second pad coupled to the first surface, the second pad having a second cross-sectional area extending in the first direction less than the first cross-sectional area; and
coupling a solder joint to the second pad and a first die interconnect of the plurality of die interconnects, the first die interconnect having a third cross-sectional area extending in the first direction less than the first cross-sectional area, the second cross-sectional area is at least equal to the third cross-sectional area;
wherein the substrate further comprises:
an upper metallization layer extending in the first direction, the upper metallization layer comprising a second plurality of metal interconnects, the second plurality of metal interconnects comprising:
a second first pad having a fourth cross-sectional area extending in the first direction and a third surface extending in the first direction; and
wherein the method further comprises:
forming a second second pad extending in the first direction and adjacent to the third surface, the second second pad having a fifth cross-sectional area extending in the first direction and less than the fourth cross-sectional area; and
coupling a second solder joint to the second second pad and a second die interconnect of the plurality of die interconnects, the second die interconnect having a sixth cross-sectional area extending in the first direction and less than the fourth cross-sectional area, the sixth cross-sectional area is less than or equal to the fifth cross-sectional area.

10. The method of claim 9, wherein the second cross-sectional area is larger than the third cross-sectional area by an amount to ensure alignment between the solder joint and the second pad.

11. The method of claim 9, wherein the first cross-sectional area is equal to the fourth cross-sectional area, the second cross-sectional area is equal to the fifth cross-sectional area, and the third cross-sectional area is equal to the sixth cross-sectional area.

12. The method of claim 9, wherein the first pad and the second first pad are coupled in the first direction to form a plane.

13. The method of claim 9, wherein the second cross-sectional area is equal to or less than 30$\pi$ square micrometers ($\mu m^2$).

14. The method of claim 9, wherein the first die interconnect of the plurality of die interconnects has a first height less than 37 micrometers (µm).

15. The method of claim 13, wherein the solder joint has a second height of less than 30 µm.

16. The method of claim 14, wherein the second pad has a third height of at least 10 µm.

* * * * *